United States Patent [19]

Chapman

[11] Patent Number: 4,698,600
[45] Date of Patent: Oct. 6, 1987

[54] CLOCK PHASE DISCRIMINATOR

[75] Inventor: Dale B. Chapman, San Jose, Calif.

[73] Assignee: International Business Machines Corporation, Armonk, N.Y.

[21] Appl. No.: 834,104

[22] Filed: Feb. 24, 1986

Related U.S. Application Data

[63] Continuation of Ser. No. 698,117, Feb. 4, 1985, abandoned.

[51] Int. Cl.$^4$ .............................................. H03L 7/00
[52] U.S. Cl. ..................................... 331/1 A; 331/17
[58] Field of Search ................ 331/1 A, 1 R, 17, 25; 328/133, 158; 307/511; 375/120

[56] References Cited

U.S. PATENT DOCUMENTS

| | | | |
|---|---|---|---|
| 3,701,039 | 10/1972 | Lang et al. | 331/1 A |
| 3,872,396 | 3/1975 | Bastide et al. | 331/1 A |
| 4,034,309 | 7/1977 | Vaughn | 331/1 A |
| 4,105,947 | 8/1978 | Crowley | 331/1 A |
| 4,123,704 | 10/1978 | Johnson | 324/78 Z |
| 4,128,812 | 12/1978 | Pavlis | 328/134 |
| 4,200,845 | 4/1980 | Mendenhall et al. | 331/1 A |
| 4,267,514 | 5/1981 | Kimsey | 328/133 |
| 4,291,274 | 9/1981 | Suzuki et al. | 328/133 |
| 4,362,957 | 12/1982 | Stern | 307/527 |
| 4,422,176 | 12/1983 | Summers | 331/1 A |
| 4,442,406 | 4/1984 | Voss | 328/134 |

OTHER PUBLICATIONS

"Disk-Separator IC Eases Encoding/Decoding Tasks", Herb Schneider, EDN Magazine, Aug. 1983.
"Phase Frequency Detector", Motorola Data Sheet 6367248, pp. 7-25 to 7-42.
"Types SN54LS297, SN74LS297 Digital Phase-Locked-Loop Filters," Texas Instruments Product Sheet 8961721, Donald G. Trohs.
IBM Technical Disclosure Bulletin, vol. 23, No. 10, Mar. 1981, p. 4697.
"CMOS Phase-Locked Loops", Solid State Scientific SCL4046B 883/4046B an SCL4446B 883/4446B, pp. 116-119.

*Primary Examiner*—Gene Wan
*Attorney, Agent, or Firm*—Brown, Martin, Haller & Meador

[57] ABSTRACT

A clock phase discriminator measures phase difference between a pair of digital clock signals to produce phase error signals used to adjust the frequency of one clock so as to reduce the phase difference. The discriminator includes a latch circuit that responds to successive transitions of the clock signals by undertaking a multistate phase measurement transition path in which only one state variable changes at a time. The latch circuit reduces the exposure of the phase discriminator to race conditions while measuring the phase difference and producing the error signals.

11 Claims, 6 Drawing Figures

CLOCK PHASE DISCRIMINATOR

This is a continuation of application Ser. No. 698,117, filed Feb. 4, 1985, now abandoned.

BACKGROUND OF THE INVENTION

This invention concerns a phase discriminator that detects the difference in phase between a pair of clock signals and produces an output for changing the frequency of one of the clock signals to a frequency that reduces the measured phase difference.

Existing phase discriminators employed to detect the difference in phase between a pair of clock signals typically employ circuitry that is sensitive to race conditions when the clock edges used to mark phase arrive at substantially the same time. Stated differently, in such circuits, the closer in phase the clocks become, the less stable are the circuits.

A typical discriminator used to measure the phase difference between a pair of clock signals, $C_1$ and $C_2$, is illustrated in FIG. 1 and includes a pair of latches, $L_1$ and $L_2$. Each latch is set by a respective one of the gates $G_1$ and $G_2$. Each gate receives one of the clock signals (through a pulse shaper PS) and the output of the other latch. Either latch is set when the output of its gate is changed by a change in state of the associated input clock. The leading clock will set its associated latch first, causing an error signal E to be produced that indicates the time by which that clock leads the other. The set latch will remain set until reset by the lagging clock. However, if a change in state of the lagging clock is presented to its gate before the lead clock latch is set, the output of the circuit will be indeterminate and can incorrectly reflect the relative phase between the signals.

As the speeds of data transfer and data processing equipments increase with each new generation of computers, the destabilizing effects of race conditions will only grow in magnitude. Therefore, there is a manifest and urgent need to reduce, and ultimately eliminate, race conditions in phase detection circuitry.

SUMMARY OF THE INVENTION

The present invention suppresses the occurrence of race conditions in a clock phase discriminator used to detect phase difference between a pair of clock signals. The circuit is characterized by the elimination of race conditions from the measuring circuitry of the discriminator.

In eliminating race conditions, the invention employs a latching circuit that measures relative phase between a pair of input clock signals by following a multi-state transition path in which each state transition results from the change of only one respective state variable.

The phase discriminator of the invention measures the difference in phase between an input clock signal of nominal frequency and a variable-frequency reference clock signal. In response to the phase difference measurement, the discriminator produces an error signal for changing the frequency of the reference clock signal in a direction tending to eliminate the phase difference. The discriminator includes a start latch, responsive to a transition of the input clock for producing a start cycle signal and a frequency divider responsive to the start cycle signal for dividing the reference clock frequency to produce a comparison clock signal having substantially the same frequency as the input clock signal.

The latch circuit of the discriminator responds to the start cycle signal, a comparison clock signal transition following the start cycle signal, and to an input clock transition following the start cycle signal by measuring the relative phase between the signals by means of a multi-state transition cycle in which each state transition results from the change of a single respective variable, and producing a phase difference signal indicative of the measured phase difference.

A gate circuit is provided that responds to the phase difference signal by producing a correction signal to change the frequency of the reference clock signal to a frequency that reduces the phase difference.

It is therefore a principle objective of the present invention to provide a phase discriminator in which race conditions are substantially eliminated.

It is a further objective of the present invention to provide a phase discriminator having a latch circuit that measures a phase difference between two clock signals by performing a multi-state transition cycle in which each state transition results from the change of a single respective state variable.

A still further objective of the present invention is to provide an improved phase discriminator for measuring the phase difference between a pair of clock signals.

These and other objectives and advantages of the present invention will become more apparent when the following detailed description is read in conjunction with the below-described drawings, in which like reference numerals indicate like elements.

DETAILED DESCRIPTION OF THE PREFERRED EMBODIMENT

The phase discriminator of the invention relates to a novel and improved apparatus for performing phase and frequency synchronization necessary in a data processing system wherein a reference clock signal must be synchronized to a clock signal provided by a servo system. For example, in a disk storage system a servo clock is provided that is synchronized to the rotational velocity of a storage disk. A reference data clock signal is used to stage data to and from the disk and must be synchronized to the servo clock to be sure that the data is written at the correct density on the disk. Without the synchronization of the clocks, the density of the data would vary as the speed of the disk varies.

Figure 2:
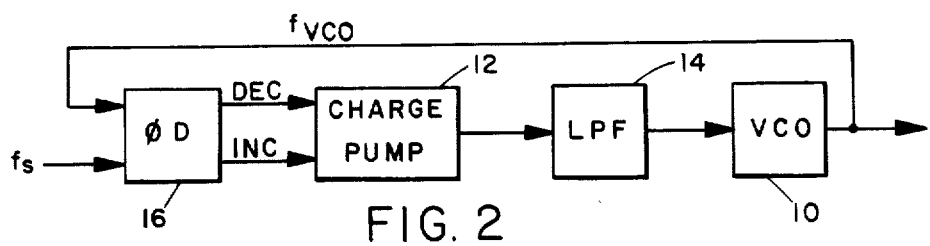
FIG. 2 is a block diagram illustrating a representative device in which the phase discriminator of the invention is preferably used.

Typically, a reference data clock in a magnetic storage access system that uses rotating disks to store data is provided from a phase-locked loop such as is illustrated in FIG. 2. The reference data clock is provided by a voltage controlled oscillator (VCO) 10 that produces the reference clock ($f_{VCO}$), the frequency of which is determined by the magnitude of a voltage signal provided by a typical charge pump 12 through a low pass filter (LPF) 14.

Charge pumps and low pass filters are known in the art, and such devices are taught in U.S. Pat. No. 4,034,309, which is assigned to the Assignee of this patent application and is incorporated herein by reference. The charge pump of the incorporated patent consists of two differentially-driven, emitter-coupled transistor pairs. The charge pump drives the low pass filter, which performs an integrating function. One of the charge pump pairs is enabled by a phase difference signal to provide a charge current to the low pass filter, which increases the magnitude of the voltage provided to the VCO, thereby increasing the frequency of the reference clock signal. The other charge pump pair responds to another phase difference signal by drawing current from the low-pass filter, thereby reducing the reference clock frequency.

In a typical phase-locked loop, the charge pump is fed by a phase discriminator that produces a pair of phase correction signals, one to increase the charge held by the low pass filter (and thus the frequency of $f_{VCO}$). The other correction signal is produced by the phase discriminator to decrease the low-pass filter voltage magnitude and with it, the frequency of $f_{VCO}$. The phase discriminator ($\phi D$) of the invention, indicated by reference numeral 16 in FIG. 2, accepts as inputs the reference data clock $f_{VCO}$ and the servo clock $f_S$ and produces as outputs an increase (INC) phase correction signal and a decrease (DEC) phase correction signal.

Figure 1:
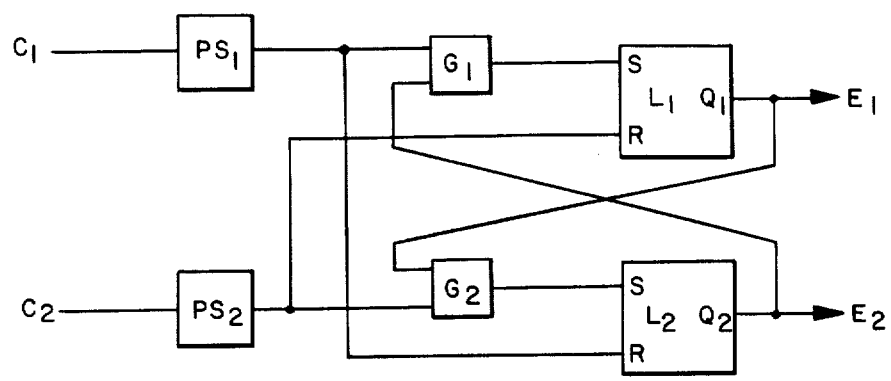
FIG. 1 is a schematic diagram illustrating a typical prior art phase discriminator for use with a pair of clock signals.
Figure 3:
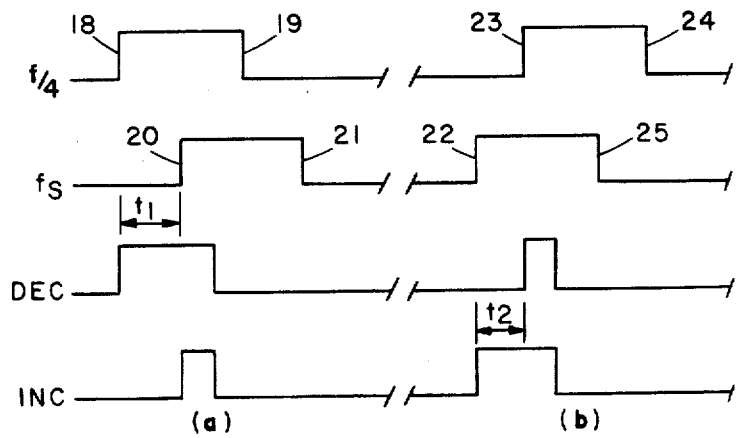
FIG. 3 is a waveform diagram illustrating the signals produced by the phase discriminator of the invention to indicate the phase difference between a pair of clock signals that are input to the circuit.

The operation of the phase discriminator 16 is illustrated by the waveforms of FIG. 3. In FIG. 3, the waveform f/4 represents a clock signal that is derived directly from $f_{VCO}$ in a manner described below. Since f/4 is derived directly from $f_{VCO}$, it is to be assumed that there is no significant variation in the phase difference between the signals. In the portion of FIG. 3 denoted by (a), the phase of f/4 leads that of $f_S$, while in the portion denoted by (b), the phase of $f_S$ leads that of f/4.

In the case denoted by (a) of FIG. 3, the phase detector 16 will produce the DEC signal for a time $t_1$ that is proportional to the phase difference between f/4 and $f_S$. This causes the charge pump 12 to reduce the charge on the LPF so as to reduce the filter voltage and hence decrease the frequency of the VCO 10. The effect of reducing the frequency of $f_{VCO}$ will be to retard the transitions of f/4 in time, thus moving them toward the transitions of $f_S$.

If $f_S$ leads f/4 in phase, then the transition 22 of $f_S$ will precede the transition 23 of f/4. This will cause the phase discriminator to place the INC signal in a positive condition. In this case, the charge pump will direct current into the LPF so as to raise the magnitude of the voltage provided to the VCO 10, which will increase the frequency of $f_{VCO}$ so that the transitions of f/4 will tend to move forward in time to catch up with the transitions of $f_S$. The phase detector 16 will keep the INC signal in a positive condition while holding the DEC signal negative for an amount of time ($t_2$) equal to the phase difference between the edges 22 and 24.

As is shown in portions (a) and (b) of FIG. 3, the phase correction signal initially output by the phase discriminator 16 to the charge pump 12 is effectively neutralized when the other correction signal is also placed in the positive state. This results because the second charge pump circuit is turned on and the increase and decrease frequency currents cancel each other out. This is necessary to prevent the occurrence of a deadband region in the response of the phase-locked loop system that would result from the finite time required to switch the charge pump current circuits. After providing both phase correction signals in their positive states for an amount of time, the phase discriminator will simultaneously deactivate them.

Figure 4:
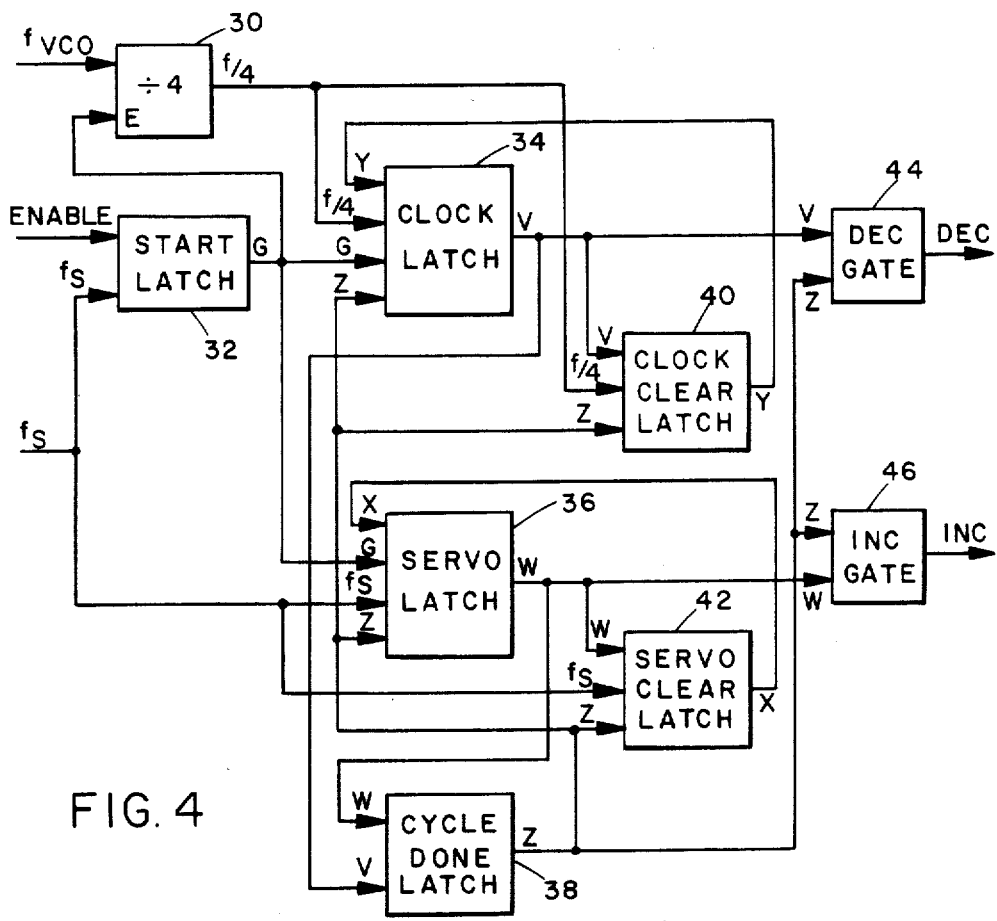
FIG. 4 is a block diagram of the phase discriminator of the invention.

The phase discriminator 16 is shown in greater detail in FIG. 4. In application, the reference data clock signal $f_{VCO}$ oscillates at approximately 48 MHz, while the servo clock $f_S$ cycles at approximately 12 MHz. Therefore, to rationalize the relationship between $f_{VCO}$ and $f_S$, a frequency divider 30 divides the frequency of $f_{VCO}$ by 4 to produce a comparison clock f/4 whose phase (which has an essentially constant phase relationship to $f_{VCO}$) is compared with that of $f_S$ in the operation of the phase discriminator. The frequency divider 30 can comprise, for example, a conventional ring counter.

The phase discriminator of the invention further includes a START latch 32. The inputs to the START latch 32 include an ENABLE signal and the servo clock signal $f_S$. The START latch 32 provides a start cycle signal, shown as G in FIGS. 4-6.

A multi-state latch circuit includes latches 34-42. The latch circuit transitions through a selected one of a plurality of multi-state phase measurement cycles, with cycle selection depending upon the relative phase of the clock signal and the result of the adjustment of $f_{VCO}$. The latch 34, called the CLOCK latch, searches for transitions of f/4. Transitions in the servo clock $f_S$ are captured by the SERVO latch 36. The end of a multi-state phase measurement cycle is determined by a CYCLE DONE latch 38. The latches 34 and 36 are prepared for the next phase measurement cycle by a CLOCK CLEAR latch 40 and a SERVO CLEAR latch 42, respectively.

The outputs of the latches 34, 36, 38, 40, and 42 are labelled V, W, Z, Y, and X, respectively. These outputs, together with f/4, G, and $f_S$, comprise the state variables that control the transition of the phase discriminator 16 through its phase measurement cycles.

As illustrated in FIG. 4, the output V of the CLOCK latch 34 is determined by the state variables Y, f/4, G, and Z. The output W of the SERVO latch 36 depends upon the state variables X, G, $f_S$, and Z. The output Z of the CYCLE DONE latch 38 is dependent upon the condition of state variables W and V. The clock clear variable Y provided by the CLOCK CLEAR latch 40 results from the condition of state variables V, f/4 and Z, while the variable X output by the SERVO CLEAR latch 42 is controlled by the state variables $f_S$, W, and Z.

The DEC and INC signals are provided by a DEC gate 44 and an INC gate 46. The DEC signal output by the DEC gate 44 depends upon the state variables V and Z that are input to the gate. The INC signal output by the INC gate 46 is determined by the state variables Z and W.

Figure 5:
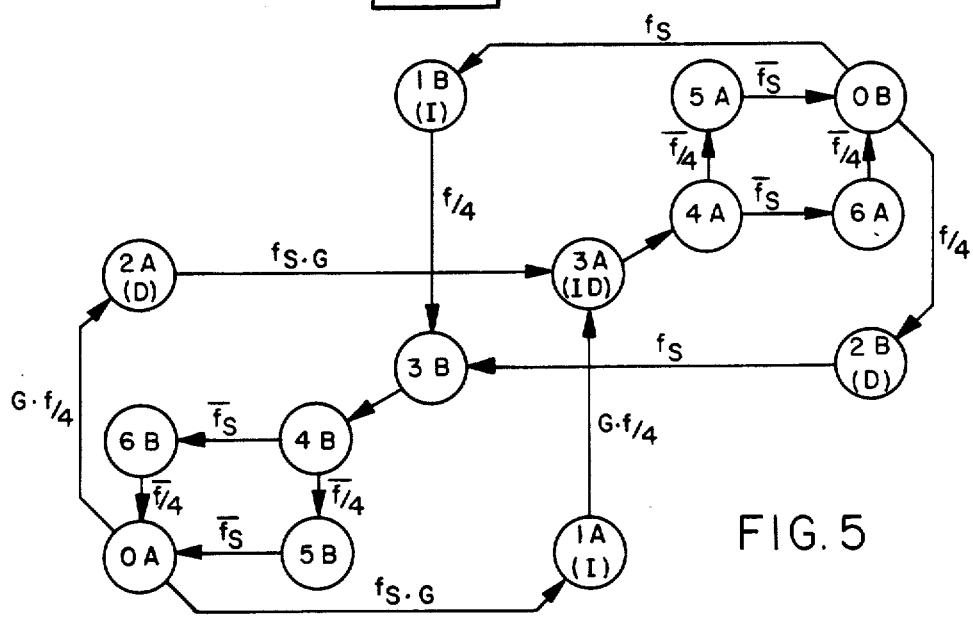
FIG. 5 is a state transition diagram illustrating the operation of the phase discriminator of FIG. 4.

The operation of the phase discriminator of FIG. 4 is illustrated by the state transition diagram of FIG. 5. Each state of the FIG. 5 diagram is determined by a particular combination of the state variables produced by the latch circuit latches 34-42. Transitions between the states are determined by the state of the start latch 32 and transitions of the servo clock $f_S$ and the comparison clock f/4. Table I associates the states of FIG. 5 with determining latch states made up of the V, W, X, Y and Z state variables.

TABLE I

| STATE NAME | LATCH STATES | STATE NAME | LATCH STATES |
|---|---|---|---|
| 0A | $\bar{V}\,W\,\bar{X}\,\bar{Y}\,\bar{Z}$ | 0B | $V\,\bar{W}\,X\,Y\,Z$ |
| 1A | $\underline{V}\,\underline{W}\,\underline{X}\,\underline{Y}\,\underline{Z}$ | 1B | $\underline{V}\,W\,X\,Y\,Z$ |
| 2A | $V\,\bar{W}\,\underline{X}\,\underline{Y}\,\underline{Z}$ | 2B | $\underline{V}\,\underline{W}\,X\,Y\,Z$ |
| 3A | $V\,W\,\underline{X}\,\underline{Y}\,Z$ | 3B | $\underline{V}\,\underline{W}\,X\,Y\,\underline{Z}$ |
| 4A | $V\,W\,\underline{X}\,Y\,Z$ | 4B | $\underline{V}\,\underline{W}\,X\,\underline{Y}\,\underline{Z}$ |
| 5A | $V\,W\,X\,\underline{Y}\,Z$ | 5B | $\underline{V}\,\underline{W}\,X\,\underline{Y}\,\underline{Z}$ |
| 6A | $V\,W\,X\,Y\,Z$ | 6B | $V\,\bar{W}\,X\,Y\,Z$ |

In Table I, conventional digital notation is used for the state variables. Thus, for example, the phase discriminator latch circuit is in state 0A when all of the latches 34–42 are reset. Similarly, the latch circuit is in state 0B when all of the latches 34–42 are set. As will be understood by those skilled in the art, the reset state of a state variable is indicated by a bar over the variable, while the set state is indicated by the absence of a bar.

The conditions for setting and resetting the latches 34–42 are given in Table II.

TABLE II

| SET CONDITIONS | RESET CONDITIONS |
|---|---|
| $V = (\bar{Y} \cdot \bar{Z} \cdot f/4 \cdot G)$ | $\bar{V} = (Y \cdot Z \cdot f/4) + \bar{G}$ |
| $W = (\bar{X} \cdot \bar{Z} \cdot f_S \cdot \underline{G})$ | $\bar{W} = (X \cdot Z \cdot f_S) + \bar{G}$ |
| $X = (W \cdot \underline{f_S}) + (\bar{W} \cdot Z \cdot f_S)$ | $\bar{X} = (\bar{W} \cdot f_S) + (W \cdot \bar{Z} \cdot f_S)$ |
| $Y = (V \cdot f/4) + (\bar{V} \cdot Z \cdot f/4)$ | $\bar{Y} = (\bar{V} \cdot f/4) + (V \cdot Z \cdot f/4)$ |
| $Z = V \cdot W$ | $\bar{Z} = \bar{V} \cdot \bar{W}$ |

Again, the notation of the state variable equations in Table II is conventional and equivalent to that utilized in Table I.

Finally, the phase correction signals output by the phase discriminator of FIG. 4 are given by equations (1) and (2).

$$INC = (\bar{W} \cdot Z) + (W \cdot \bar{Z}) \quad (1)$$

$$DEC = (\bar{V} \cdot Z) + (V \cdot \bar{Z}) \quad (2)$$

As is evident, the variable terms of equations (1) and (2) are produced by the action of the latches 34–42. Each term represents a respective phase difference signal, and during each phase measurement cycle, the latches 34–42 will produce a respective phase difference signal from one equation, followed by another respective phase difference signal from the other equation to effect production of the INC and DEC signals in one of the sequences shown in FIG. 3.

To begin operation, the start latch 32 and the latch circuit latches 34–42 are all initially reset. Next, the ENABLE signal is placed in a high digital state. This may be provided by conventional circuitry when, for example, data is transferred to or from a rotating magnetic disk to which the servo clock $f_S$ is synchronized.

At the first positive transition of the servo clock $f_S$ following provision of the ENABLE signal, the START latch 32 will provide a start cycle signal G. When the start cycle signal is provided, the frequency divider 30 will begin operation and the first transition of f/4 will be aligned in phase with the transition of $f_S$ that sets the START latch 32. This causes the f/4 and $f_S$ to start substantially in phase, which persons skilled in the art will realize speeds up the phase lock process.

Assuming now that the start cycle signal G is positive, the latch circuit is in state 0A, and that a transition of $f_S$ is detected before a transition of f/4, the relative phase condition illustrated in (b) of FIG. 3 will exist, wherein $f_S$ leads the comparison clock signal in phase. In this case, the phase discriminator will undertake a state transition cycle resulting in the provision of an INC signal to increase the frequency of $f_{VCO}$ and eliminate the phase difference between f/4 and $f_S$. This is accomplished in the following manner.

While in state 0A, if the first transition of $f_S$ precedes the first transition of f/4, the set conditions defined in Table II to set the SERVO latch 36 and raise its W output will be satisfied. Since the CYCLE DONE latch 38 will not yet be set, the conditions for the INC signal defined by the second term of equation (1) will be satisfied and the INC gate 46 output will assume a positive state causing the charge pump 12 to raise the voltage provided to the VCO and increase the frequency of $f_{VCO}$. This is indicated by (I) in state 1A of FIG. 5. The term will remain true for at least an amount of time equal to the phase error present. This time is represented by $t_2$ in FIG. 3.

When the first positive transition of f/4 following the $f_S$ transition arrives, the CLOCK latch 34 is set, which causes state variable V to assume a positive state. This places the logic circuit in state 3A. At this point the second term of equation (2) also becomes true, causing the output of the DEC gate 44 to rise. As explained above, this neutralizes the INC signal and disables the charge pump 12.

Once the phase detector latch circuit enters state 3A, the transition to state 4A is automatic because the set conditions for the CYCLE DONE latch 38 exist. In state 4A, the outputs of the gates 44 and 46 transition substantially simultaneously to a low state. This happens because the state variables V, W, and Z are all in their positive conditions, which prevents any of the terms in equation (1) or equation (2) from being satisfied.

Following the entry into state 4A, the frequency of $f_{VCO}$ will have been adjusted through the action of the charge pump 12, LPF 14 and the VCO 10. This will advance the succeeding transitions of the comparison clock in FIG. 3 in time toward the transitions of $f_S$. If the negative transition 24 precedes the negative transition 50 of the servo clock, then the phase discriminator latch circuit will enter state 0B by way of state 5A by setting first the CLOCK CLEAR latch 40 and then the SERVO CLEAR latch 42. Alternatively, if the negative transition 24 is after the negative transition 25 in time, the phase detector circuit will enter state 0B by way of state 6A. In transitioning through state 6A, first the SERVO CLEAR latch 42 will be set by the negative transition of $f_S$ and then the CLOCK CLEAR latch 40 will be set by the negative transition 48 of the comparison clock.

The transitions just described are summarized in Table III. Both columns of the Table represent measurements of a phase difference by which $f_S$ leads f/4. The left-hand column is a measurement cycle in which the transition 24 precedes transition 25, while the right-hand column is a cycle in which the transition 25 precedes the transition 24.

TABLE III

| TRANSITION THROUGH 5A | TRANSITION THROUGH 6A |
|---|---|
| 0A | 0A |
| 1A | 1A |

TABLE III-continued

| TRANSITION THROUGH 5A | TRANSITION THROUGH 6A |
|---|---|
| 3A | 3A |
| 4A | 4A |
| 5A | 6A |
| 0B | 0B |

It should be evident that the cycle just described is completed between the positive transition 22 and the later of either the negative transition 24 in the comparison clock f/4 or the negative transition 25 of the servo clock $f_S$. Thus, the phase discriminator will be prepared to undertake another phase measurement cycle in response to the first positive transition of either clock following the end of the just-described cycle. This permits the phase discriminator to measure the phase difference of the clocks on each cycle of $f_S$.

Returning to state .0A, in the event that the first positive transition is in the comparison clock signal f/4, the set of conditions illustrated by the (a) portion of FIG. 3 will obtain. That is, the comparison clock f/4 (and, therefore, the reference data clock $f_{VCO}$) will lead the servo clock $f_S$ in phase, causing the phase discriminator to provide an error signal for decreasing the frequency of $f_{VCO}$ in an attempt to align the phases of f/4 and $f_S$. Under these circumstances, the CLOCK latch 34 will be set by the positive transition 18 of f/4 that precedes the positive transition 20 of the servo clock $f_S$. This will cause a transition from state 0A to state 2A wherein the latch circuit will cause the second term of equation (2) to go true and activate the DEC signal for a time equal to the phase error between the servo clock $f_S$ and the comparison clock f/4. This time is represented by $t_1$ in FIG. 3. Then, the positive transition 20 of $f_S$ will carry the latch circuit to state 3A, raising the INC signal and neutralizing the DEC signal. The effect of the $t_1$ duration of the DEC signal will be to move succeeding transitions of f/4 toward the transitions of $f_S$. The latch circuit will then progress automatically to state 4A and therefrom to state 0B in the manner described above.

It should be evident that transition cycles proceeding from state 0A through state 2A can be constructed from the transition cycles of Table III simply by substituting state 2A for each occurrence of state 1A.

Once in state 0B, the response of the latch circuit from state 0B back to state 0A will be exactly the same as the response from state 0A, except that, at the beginning of a transition cycle from state 0B, all of the latches 34–42 will be set. Then, a transition cycle will be followed through state 1B (corresponding to state 1A) to increase the frequency of $f_{VCO}$ and through state 2B to decrease the frequency of $f_{VCO}$.

It should be evident from Table I that the B suffix states are the complements of the A suffix states. Thus, all of the transitions from 0B to 0A are the complements of the corresponding transitions from 0A to 0B. This permits the phase discriminator to oscillate back and forth between two equivalent standby states, 0A and 0B, without having to initialize the latch circuit at the end of each transition cycle. This is convenient because it eliminates an extra state transition, which would otherwise reduce the phase discriminator's speed of operation.

To stop the operation of the phase discriminator, the ENABLE signal is removed, which resets the START latch 32 and puts the start cycle signal into a low logic level state $\overline{G}$. Although not illustrated in the transition diagram in FIG. 5, it should be evident upon inspection of Table II that $\overline{G}$ will cause the phase discriminator to transition from state 0B to state 0A by resetting the CLOCK and SERVO latches 34 and 36, which will force the circuit to go to state 4B, and from there, with successive transitions of f/4 and $f_S$, to state 0A. When the start cycle signal is disabled ($\overline{G}$), 0A becomes a reset state.

Although a variety of circuit technologies exist for implementing the latches 32–42 and the gates 44–46, the inventor has found that conventional cascaded emitter coupled logic (CECL) provides several advantages over conventional single-ended logic circuitry such as TTL. The use of differential logic circuitry such as CECL reduces the effects of noise and other external influences in causing a variation in the delay characteristics of the latch circuits. Further, the variations due to differences between rise and fall times are reduced since every state transition involves one or more pairs of differential signals. Finally, as is known, differential logic circuits provide a better noise margin than is obtained with single-ended logic circuits. This permits smaller signal swings to be used, which results in a better speed/power product for the latch circuits.

Figure 6:
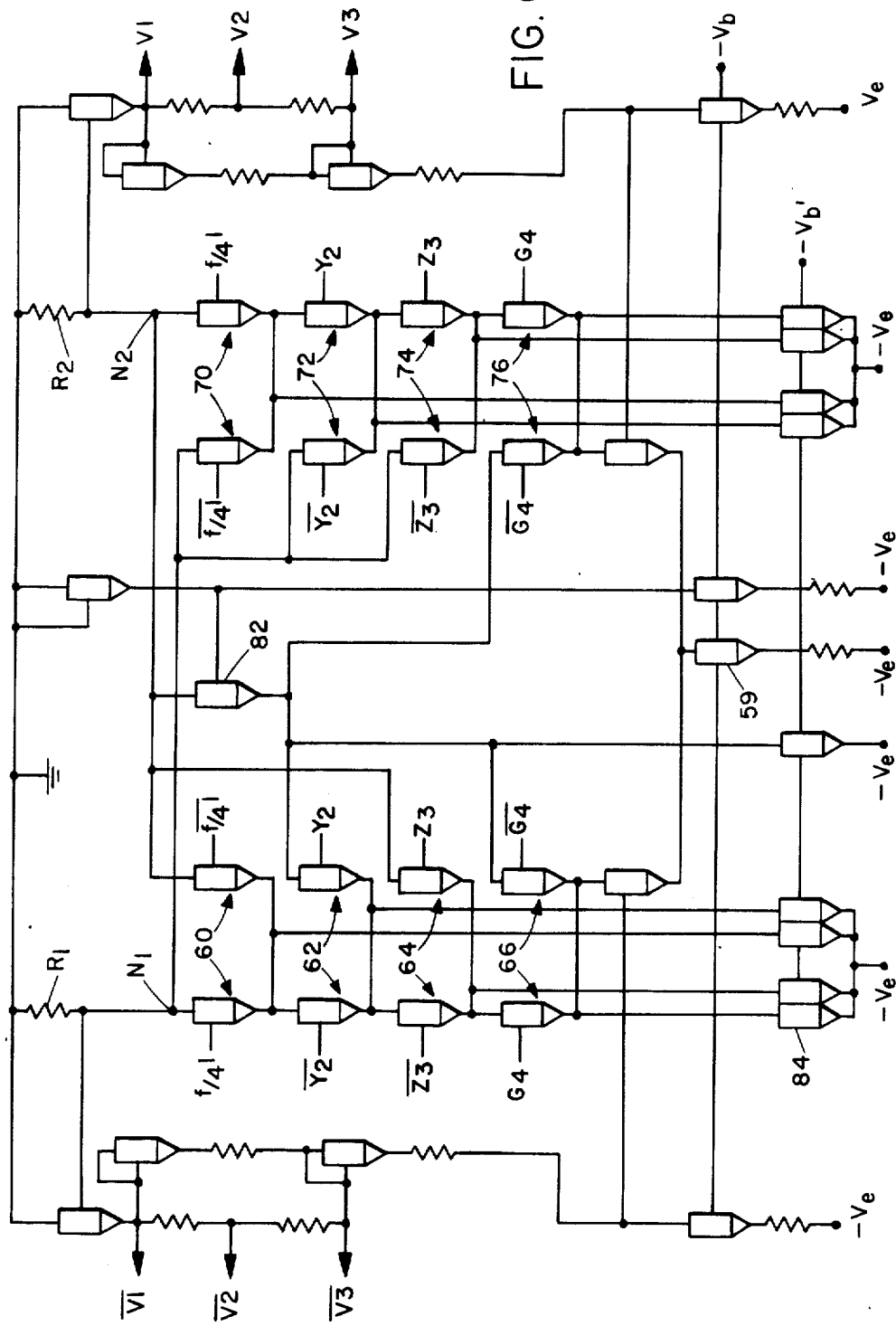
FIG. 6 is a circuit diagram illustrating a representative implementation of one latch of the phase discriminator illustrated in FIG. 4.

An example of implementing the latches 32–42 in CECL is provided in FIG. 6, which is a schematic representation of a CECL circuit that is functionally equivalent to the CLOCK latch 34. As is typical with CECL circuits, two cascaded sets of emitter coupled transistor pairs 60–66 and 70–76 are used to implement logic internal to the latch that will provide the response to the input state variables required to set and reset the variable V that is output by the latch. Thus, when the latch is reset, each of the positive-sense state voltages $\overline{V1}$, $\overline{V2}$, and $\overline{V3}$ will be at a lower voltage than the corresponding one of the negative-sense output voltages V1, V2, and V3. The set or reset state is determined by diversion of the current from the main current source transistor 80 through successive ones of the emitter coupled switch pairs 60–66, and 70–76, which are connected in such a manner as to allow a number of logical decisions to be made while only expending the dissipation of a single current path. In order to balance the loading of the resistors $R_1$ and $R_2$, over which the differential output signals are developed, transistor 82 is added to the circuit and its collector is connected to R2. This provides a collector loading on the resistor $R_2$ that is substantially equivalent to the collector loading on resistor $R_1$, which makes the time constants at nodes $N_1$ and $N_2$ more nearly equal than would otherwise be the case. This substantially equalizes the times required to set and to reset the CLOCK latch 34. The same resistor loading equalization is provided in the SERVO latch 36, so that the transition times from state 0B to state 1B and to state 2B are substantially equivalent to the transition times to states 1A and 2A from 0A.

One further addition to the CECL circuits of the latches 32–42 is the provision of trickle current transistors, one of which is indicated by 84 in FIG. 6. Each of the trickle transistors is biased by a voltage $-V_b'$ to keep the emitter coupled transistor pair to which it is connected in a low current-on state so that, when the switch below the pair is switched to provide current, the pair will quickly pass on the current. The current from the trickle current transistors, is substantially lower than the current produced by the main current source transistor 59. Without a trickle transistor, the node to which the emitters of a respective pair was attached could float to a voltage near the positive power supply due to minute leakage currents that are commonly found within transistor technologies. If a node were to be sitting at such a voltage when the current was switched to it, the current would have to first slew the node back to the proper operating voltage by discharging the parasitic capacitance associated with the node. This would considerably reduce the speed of the circuit and would cause the response time of the circuit to vary depending upon the length of time that had expired since it was last activated.

Finally, the outputs—$V_1$, $V_2$, $V_3$, $\overline{V_1}$, $\overline{V_2}$, and $\overline{V_3}$—are fed to latches 38 and 40 and gate 44 through emitter-coupled transistor pairs such as the pairs 60–66 and 70–76. These outputs can be understood by observing the right-hand side of the FIG. 6 latch where the outputs $V_1$–$V_3$ are developed. Since $V_1$–$V_3$ represent the positive phase of the complementary output signals provided by the latch 34, they will be referred to as the positive phase outputs. Inspection of FIG. 6 will show that the positive phase outputs are developed across an output signal network including a resistance ladder in parallel with an output signal voltage-determining network leg. The resistance ladder consists of the series-connected output resistors $R_{S1}$ and $R_{S2}$. The positive phase outputs are developed at the series of nodes $N_3$, $N_4$, and $N_5$ resulting from the series connections of the output resistors. The output signal voltage determining network leg is provided in parallel with the output resistance ladder and consists of a diode-connected transistor $D_1$ connected in series with a resistor $R_{C1}$. The output network including the output resistance ladder and the voltage-determining network leg is connected through another voltage-determining network leg consisting of a diode-connected transistor $D_2$ and resistor $R_{C2}$ in series with one of the current source transistors 59. The voltage-determining network leg consisting of $D_1$ and $R_{C1}$ establishes a voltage drop across the output resistance ladder that consists of the base-to-emitter voltage of the transistor $D_1$ and the voltage dropped across the resistor $R_{C1}$. The output resistance ladder and the voltage-determining network maintain the magnitude of $V_1$, $V_2$, and $V_3$ such that saturation is prevented in the input transistor pairs in the latches 38 and 40, and gate 44. As is evident to those skilled in the art, biasing of a transistor at saturation will slow its response to input signal changes owing to the need to discharge excess minority carriers. In addition, components $D_2$ and $R_{C2}$ maintain the magnitude of the voltage at $N_6$, the positive phase signal to one of the two main switching transistors TS1, at a level that will prevent saturation of TS1 and current source transistor 59. Therefore, the output network illustrated in FIG. 6 assists in maintaining quick response by the latches to which the output signals are fed.

Of course, it is within the capability of a skilled circuit engineer to convert the state variable signals in FIG. 4 to the multi-level, differential signals required to operate CECL.

Obviously, many modifications and variations of the phase discriminator of the invention are possible in light of the teachings of this description. Therefore, it is to be understood that, within the scope of the following claims, the invention may be practiced in a manner that has not been specifically described.

I claim:

1. A phase discriminator, responsive to the difference in phase between an input clock signal and a variable-frequency reference clock signal, for producing phase correction signals that are used to change the frequency of said reference clock signal, comprising:
   means responsive to an input clock signal for producing a start cycle signal;
   latch circuit means, responsive to a transistion of a reference clock signal following said start cycle signal and to an input clock signal transistion following said start cycle signal for measuring a phase difference between said input and reference clock signals by producing and changing variable signals defining a multi-state transition cycle, in which each state transition results from the change of a single respective variable signal, and for producing phase difference signals indicative of the measured phase difference; and
   gate means responsive to said phase difference signals for producing a phase correction signal to change the frequency of said reference clock signal to a frequency that reduces said phase difference.

2. The phase discriminator of claim 1 wherein said phase difference signals further indicate which of said clock signal transitions occurred first.

3. The phase discriminator of claim 1 wherein said latch circuit means includes plural binary latches, each binary latch having an input connected to the output of at least one other binary latch and changing state in response to the change of output of only a respective one of said other binary latches.

4. The phase discriminator of claim 3 wherein one said binary latch comprises a differential, emitter-coupled circuit.

5. The apparatus of claim 4 wherein said latch includes a differential emitter-coupled circuit with a signal output network comprising:
   a resistance ladder including a plurality of series-connected resistors, in which respective outputs of said latch are provided from connection nodes within and at either end of said series-connected resistors; and
   an output signal voltage-determining leg in parallel with said resistance ladder network and including, in series, a semiconductor element having a predetermined forward bias voltage and a resistance element, in which the combined signal voltage drop across said leg maintains the respective output signal voltage at each node paralleled by said leg at or above a predetermined level.

6. A phase measurement apparatus, comprising:
   start latch means responsive to an input clock signal of nomial frequency for producing a start cycle signal;
   divider means responsive to said start cycle signal and to a variable-frequency reference clock signal for producing a comparison clock signal having substantially the same frequency as said input clock signal;
   phase measurement cycle means responsive to a comparison clock signal transition following said start cycle signal signal and to an input clock transition following said start cycle signal for measuring a phase difference between said input and reference clock signals by producing a plurality of variable signals and changing said variable signals according to a predetermined pattern defining a multi-state phase-measurement cycle in which each state transition results from the change of a single respective variable signal; and gate means responsive to said phase measurement cycle means for producing correction signals to change the frequency of said reference clock signal by an amount that reduces said measured phase difference.

7. The apparatus of claim 6 wherein, if said comparison clock transition precedes said input clock transition, said phase measurement cycle means produces a first phase difference signal for a time corresponding to the time separating said clock signal transitions or, if said input clock transition precedes said comparison clock transition, said phase measurement cycle means produces a second phase difference signal for a time corresponding to the time separating said clock signal transitions.

8. The apparatus of claim 7 wherein said gate means responds to said first phase difference signal by producing a decrease correction signal to decrease said reference clock signal frequency or to said second phase difference signal by producing an increase correction signal to increase said reference clock signal frequency.

9. The apparatus of claim 6 wherein said predetermined pattern comprises two complementary multistate transition cycles in each of which at least one state is the complement of a respective state in the other.

10. The apparatus of claim 9 wherein each of said transition cycles includes an initial and an ending state, and the initial state of each of said cycles comprises the ending state of the other of said cycles.

11. The apparatus of claim 6 wherein said phase measurement cycle means includes plural binary latches, each of said latches having an output corresponding to a respective variable signal and an input connected to receive the output of at least one other of said binary latches, and wherein each of said latches changes its output in response to the change in output of only one of the others of said latches.

* * * * *

UNITED STATES PATENT AND TRADEMARK OFFICE
CERTIFICATE OF CORRECTION

PATENT NO. : 4,698,600

DATED : October 6, 1987

INVENTOR(S) : Dale B. Chapman, et al.

It is certified that error appears in the above-identified patent and that said Letters Patent is hereby corrected as shown below:

On the front face of the patent, the Applicants should be identified as "Chapman et al. --, and in item [75], the inventorship should be changed to read:
-- Inventors: Dale B. Chapman, San Jose, California and Jack H. Chien, San Jose, California --

Column 10, line 53, claim 6, change "nomial" to -- nominal --

Column 10, line 62, claim 6, delete "signal" (second occurrence), and after the word "clock," insert -- signal --.

Signed and Sealed this

Fourteenth Day of June, 1988

Attest:

DONALD J. QUIGG

*Attesting Officer*   *Commissioner of Patents and Trademarks*